(12) United States Patent
Walker

(10) Patent No.: US 6,539,503 B1
(45) Date of Patent: Mar. 25, 2003

(54) METHOD AND APPARATUS FOR TESTING ERROR DETECTION

(75) Inventor: Shawn Kenneth Walker, Fort Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/448,344

(22) Filed: Nov. 23, 1999

(51) Int. Cl.$^7$ .............................. G06F 11/00; H02H 3/05
(52) U.S. Cl. ............................. 714/703; 714/32; 714/41
(58) Field of Search ................................ 714/703, 741, 714/41, 32, 40, 39, 25, 27, 28, 31, 33, 15, 16; 703/13, 14, 15, 22, 23

(56) References Cited

U.S. PATENT DOCUMENTS

| | | |
|---|---|---|
| 5,513,339 A | 4/1996 | Agrawal et al. ............ 395/500 |
| 5,668,816 A | 9/1997 | Douskey et al. ........... 371/21.3 |
| 5,671,352 A | 9/1997 | Subrahmaniam et al. ...................... 395/183.17 |
| 5,822,511 A * | 10/1998 | Kashyap et al. ............ 700/182 |
| 5,859,999 A | 1/1999 | Morris et al. ............... 395/565 |
| 5,860,017 A | 1/1999 | Sharangpani et al. .. 395/800.23 |
| 5,872,910 A | 2/1999 | Kuslak et al. ......... 395/183.17 |
| 5,920,490 A * | 7/1999 | Peters ........................ 714/744 |
| 6,154,801 A * | 11/2000 | Lowe et al. ................ 710/119 |

FOREIGN PATENT DOCUMENTS

GB 2226168 A 6/1990 ........... G06F/11/10

OTHER PUBLICATIONS

Wolfe, A., "Patents shed light on Merced's Innards", Electronic Engineering Times, Feb. 15, 1999. pp. 43–44.

* cited by examiner

Primary Examiner—Christine T. Tu

(57) ABSTRACT

Disclosed is a device and method for testing of a program or a design of an electronic device comprising digital logic circuitry. The method comprises testing the design of software or an electronic device and injecting, after initiation of the testing step, a predetermined error pattern into a value operated upon by the design of the digital logic circuitry. In a preferred embodiment, the software is a simulation of the design of a processor having a cache with error detection and/or correction circuitry. A triggering condition is preferably a cache hit, in response to which a detectable error is injected into the cache. The simulated operations of the model are observed to determine whether the injected error is detected, as should happen if the processor's error detection circuitry has been designed properly. In another respect, the invention is an apparatus, or computer software embedded on a computer readable medium, for testing a program comprising an error detector. The apparatus or software comprises the program, an error injector module connected to the program; and a checker module connected to the program. The checker module is capable of determining whether the program responds appropriately to an error dynamically produced by the error injector module during execution of the program. By injecting errors dynamically the invention easily facilitates precisely focused testing at any time during simulated operation regardless of initialization conditions.

19 Claims, 6 Drawing Sheets

METHOD AND APPARATUS FOR TESTING ERROR DETECTION

TECHNICAL FIELD

The invention relates to testing of error detection. More particularly, the invention relates to methods and equipment for testing error detection and/or correction in a program, such as a design simulation of a processor or a similar digital logic device.

BACKGROUND ART

Whenever a new electronic device is designed, it is necessary to test the device to verify that it performs as intended. This is particularly true for electronic devices comprising digital logic circuitry. Because the number of digital logic variables can be large and because each variable can be in a number of states, the possible combinations and permutations of conditions for a digital logic circuit can be enormous. This is especially true for large, complex digital logic circuits, such as processors (including, for example, general purpose microprocessors, mathematical processors or coprocessors, digital signal processors, or other special purpose processors, controllers, microcontrollers, or microprocessors), which, accordingly, present challenges for testing and verification.

An arrangement 100 for testing a design of a digital logic device is illustrated in FIG. 1. Rather than testing the actual hardware device, the arrangement 100 tests the design of the device using software models and emulations. Device model 105 is a fairly accurate and detailed model of the actual device. Typically, the device model 105 is expressed in a hardware description language (HDL), such as VHDL or Verilog, both of which are known in the art. Initialization test vectors 110 are applied to the device model 105. The initialization test vectors 110 are internal digital variable values that place the device model 105 into a known initialized state. The initialization test vectors 110 are also applied to a device emulator 115, which is a simplified functional model of the device. The device emulator 115 differs from the device model 105 in that the device model 105 is a close approximation to the actual device, whereas the device emulator 115 represents only the functionality of the device, as ideally envisioned by the designer. With a predetermined initial condition set by the initialization test vectors 110, both the device model 105 and the device emulation 115 are simulated in operation. A monitor 120 observes the outputs of the devices 105 and 115, noting any differences. If differences are present, then the device model 105 has not performed as it was intended to perform, and the design of the device must be modified.

FIG. 2 shows a more particular testing arrangement 200. In FIG. 2, the focus of testing is a subpart of the device, although other portions of the device related to the subpart can also be tested in the arrangement 200. More specifically, an error detector of the device is the focus of testing. The error detector is capable of detecting, and possibly correcting, some types of data corruption (i.e., errors in data, addresses or other types of values manipulated by the device). Like the general arrangement 100, the arrangement 200 of FIG. 2 utilizes a device model 205 and a relatively less sophisticated device emulator 215. Initialization test vectors 210 are loaded into both the device model 205 and the device emulator 215 to set internal registers, counters and the like to a predetermined state. Then, the operation of both the device model 205 (including an error detector model 225) and the device emulator 215 are simulated while the checker 220 compares them. To test the error detector model 225 using the arrangement 200, it is necessary to construct the initialization test vectors 210 appropriately so as to contain detectable errors. The arrangement 200, while useful, is limited in many respects in its ability to effectively test the error detection section of the device.

SUMMARY OF INVENTION

In one respect, the invention is a method for improved testing of the design of an electronic device comprising digital logic circuitry. The method comprises testing the design of an electronic device and injecting, after initiation of the testing step, a predetermined error pattern into a value operated upon by the design of the digital logic circuitry. In a preferred embodiment, the electronic device is a processor having a cache with error detection and/or correction circuitry, and the design of the processor is tested by simulating operation of the processor using a model. A cache hit is a triggering condition, in response to which a detectable error is injected into the cache. The simulated operations of the model are observed to determine whether the injected error is detected, as should happen if the cache's error detection circuitry has been designed properly.

In another respect, the invention is an apparatus for improved testing of a program comprising an error detector. The apparatus comprises the program, an error injector module connected to the program, and a checker module connected to the program. The checker module determines whether the program responds appropriately to an error dynamically produced by the error injector module during execution of the program.

In yet another respect, the invention is computer software embedded on a computer readable medium. The computer software comprises a software program comprising an error detector, an error injector module connected to the software program, and a checker module connected to the software program—all in software form. The checker module is capable of determining whether the program responds appropriately to an error dynamically produced by the error injector module during execution of the program.

In comparison to the initialization-based testing arrangements, certain embodiments of the present invention are capable of achieving certain advantages, including the following:

(1) Existing components (e.g., initialization test vectors, device models, device emulations, and checker) of the initialization-based testing arrangement can be utilized with little or no modification. Most importantly, large libraries of pre-existing initialization test vectors are already available for use with the present invention.

(2) The present invention is better able to test "corner cases" that arise from "in-flight" operations. In designs employing error correction along with error detection, the initialization-based arrangement can only test a given error condition once, after which the error is typically corrected, never to appear again. The present invention, however, can inject the same error condition after its initial injection, as many times as desired, to test the error detection circuitry under multiple operating scenarios further in-flight.

(3) Testing with greater focus is possible with the present invention, because greater control can be exercised as to when and where to inject errors.

(4) Errors can be injected into data structures that cannot effectively be initialized using initialization test vectors. For example, buffers, queues or the like that get flushed or updated may not be able to hold an initial value long enough to test the error detection circuitry. However, the present invention is not limited to errors present at initialization.

Those skilled in the art will appreciate these and other advantages and benefits of various embodiments of the invention upon reading the following detailed description of a preferred embodiment with reference to the drawings.

DETAILED DESCRIPTION OF A PREFERRED EMBODIMENT

Figure 1:
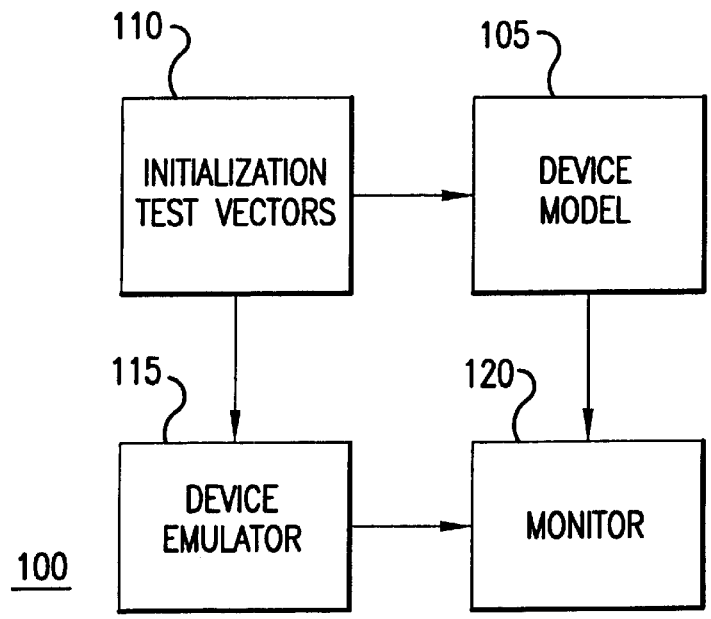
FIG. 1 is a block diagram of an initialization-based testing arrangement for a general device.
Figure 2:
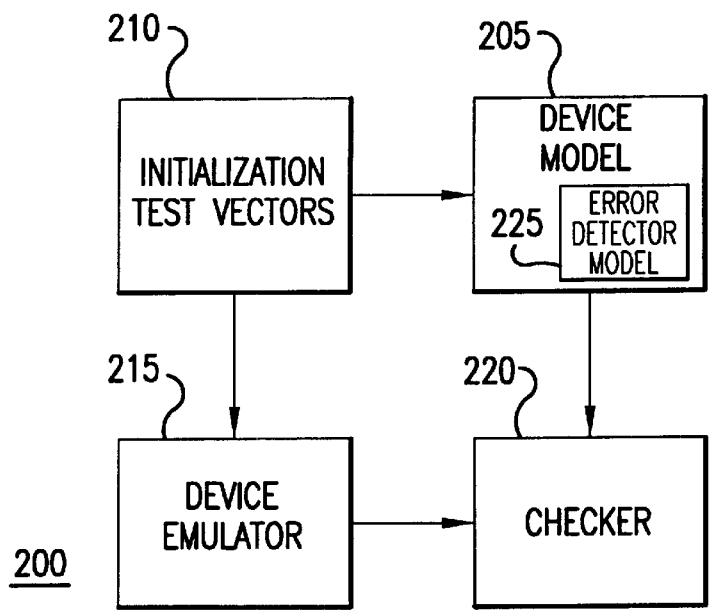
FIG. 2 is a block diagram of an initialization-based testing arrangement for a device with error detection circuitry.
Figure 3:
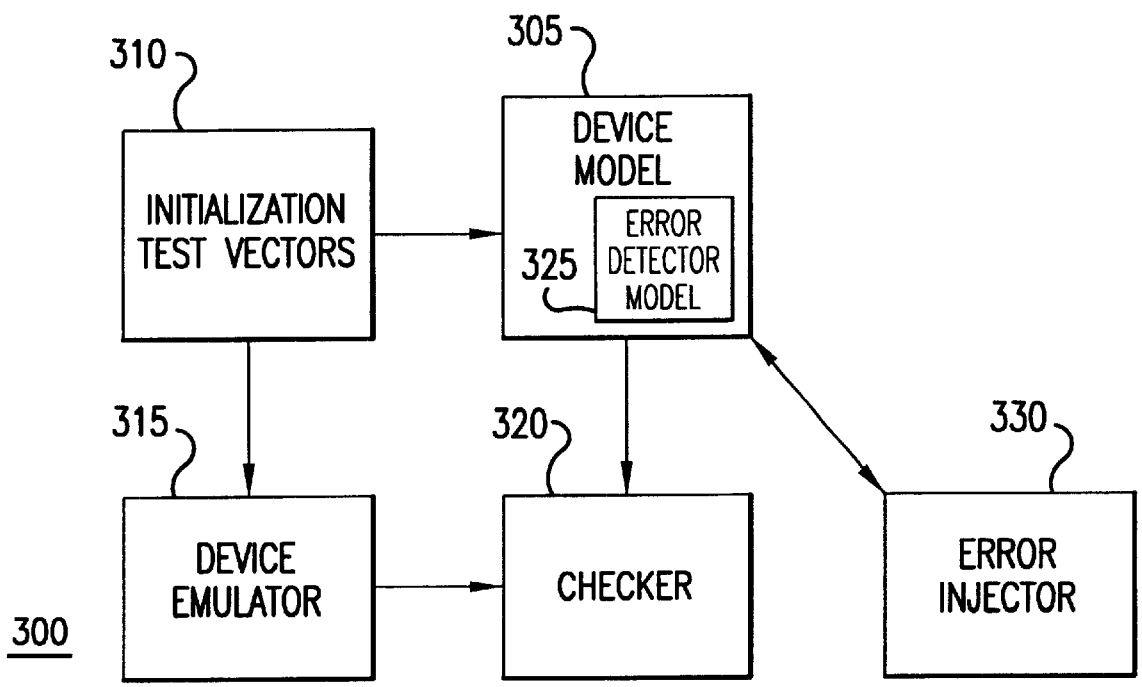
FIG. 3 is a block diagram of a testing arrangement according to one embodiment of the present invention.

FIG. 3 is a block diagram of a testing arrangement 300 according to one embodiment of the present invention. FIG. 3 shows the testing arrangement 300 having an error injector 330 along with other elements similar or identical to those from the testing arrangement 200 (FIG. 2). The error injector 330 is a software module that connects to the device model 305. Typically, the error injector 330 runs in parallel (e.g., in the background or the foreground) with the simulated operation of the device model 305 and has shared access to the data structures that the device model 305 uses to simulate internal device operations. The error injector 330 monitors operation of the device model 305, waiting for a predetermined event or condition that triggers error injection. Upon detection of a triggering event or condition, the error injector 330 writes an error pattern into a particular part of the data structures that the device model 305 uses to simulate internal device operations. As a result, simulation of the operation of the device model 305 proceeds with an erroneous value. When the simulation of the device model 305 loads the erroneous value into the error detector 325, the error detector 325, if designed properly, detects the error. If the error detector 325 also has error correction capability, then the error is corrected, in which case, the device model 305 outputs the exact same result as the device emulator 315. Alternately, the checker 320 can correct errors that the error detector 325 detects. As another alternative, the error injector 330 can be integrated within the device model 305, rather than being or existing as a separate module.

Figure 4:
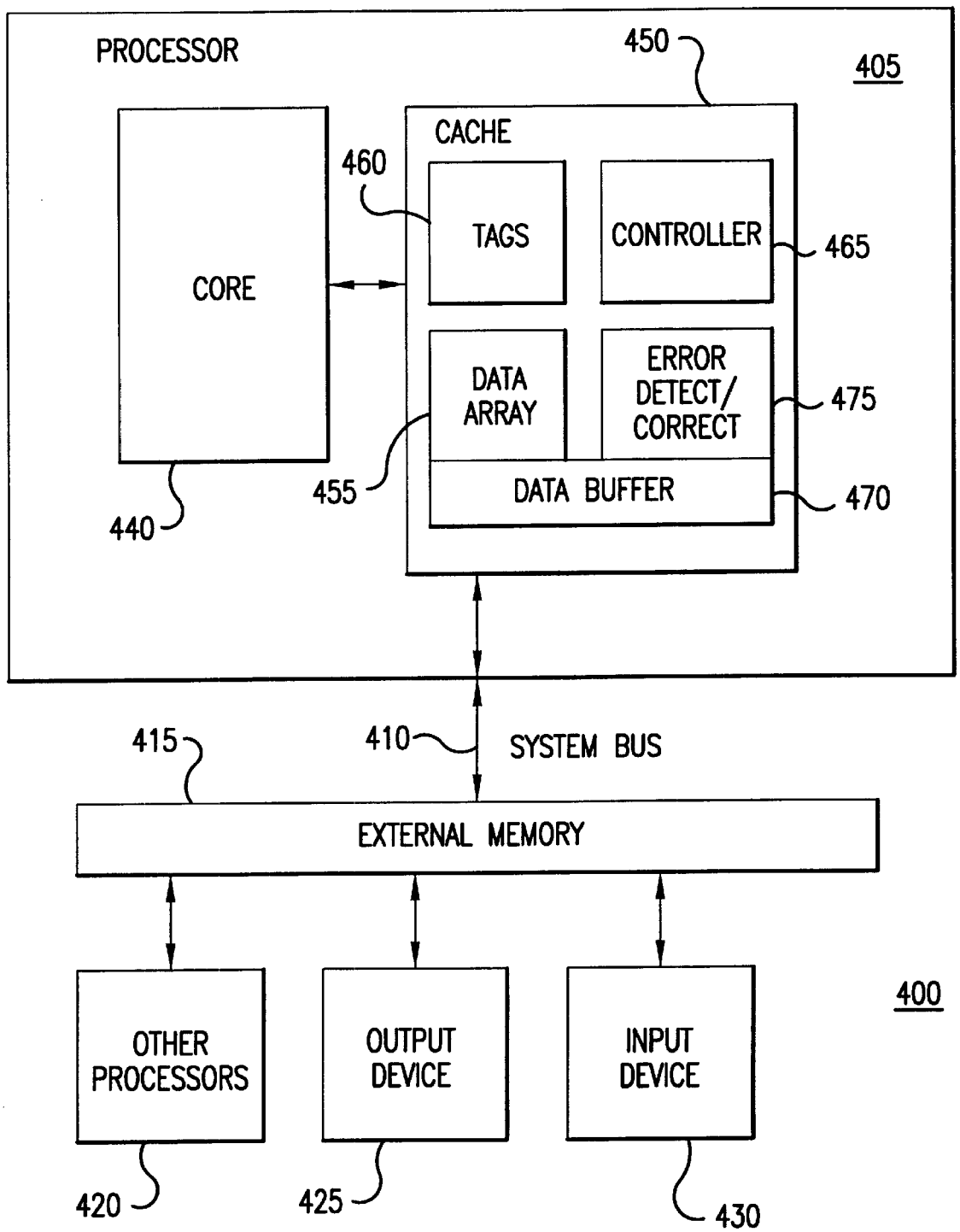
FIG. 4 is a simplified block diagram of a computer system.

In one embodiment of the present invention, the device whose design is being tested is a computer 400, as illustrated in FIG. 4. The most significant components of the computer 400 are a processor 405, a system bus 410, an external memory 415 and other devices, connected to the external memory 415, such as one or more other processors 420, an output device 425 and an input device 430. The processor 405 and the other devices may be connected to the external memory 415 via the same system bus 410. The processor 405 includes a core 440 and a cache memory (or more simply "cache") 450. The core 440 fetches instructions, does mathematical and logical operations, and reads and stores data to/from memory.

In the computer 400, as in most computers, the interface between the processor core 440 and external (main) memory 415 is critically important to the performance of the system. Because fast memory is very expensive, external memory 415 in the amount needed to support the processor 405 (and other processors 420) is generally much slower than the processor 405. In order to bridge the gap between fast processor cycle times and slow memory access times, the cache 450 is utilized. The cache 450 is a relatively small amount of very fast, zero wait state memory that is used to store a copy of frequently accessed data and instructions from the external memory 415. The processor 405 can operate out of the very fast cache 450 and thereby reduce the number of wait states that must be interposed during memory accesses. When the processor core 440 requests data from the main memory 415 and the data resides in the cache 450, then a cache read "hit" takes place, and the data can be returned to the processor core 440 from the cache 450 without incurring wait states. If the data is not in the cache 450, then a cache read "miss" takes place, and the memory request is forwarded along the system bus 410 and the data is retrieved from the main memory 415, as would normally be done if the cache 450 did not exist. On a cache miss, the data that is retrieved from the main memory 415 is provided to the processor core 440 and is also written into the cache 450 because the statistical likelihood that the same data will be requested again by the processor core 440 in the near future is high.

The individual data elements stored in the cache 450 are referred to as "lines." Each line of a cache is meant to correspond to one addressable unit of data in the main memory 415. A cache line thus comprises data and is associated with a main memory address in some way. Schemes for associating a main memory address with a line of cache data include direct mapping, full association and set association, all of which are well known in the art. Lines of cache are identified by "tags," which include the address of the line and possibly other information such as coherency, inclusion or other cache data attributes well known to those in the art.

The cache 450 includes a data array 455, a tag table 460, a cache controller 465, a data buffer 470 and an error detection/correction section 475. The data array 455 is the memory where lines are stored. The tag table 460 stores the tags for the lines stored in the data array 455. The cache controller 465 performs cache management functions. The data buffer 470 can be used to buffer data flow between the cache 450 and the external memory 415.

Figure 5:
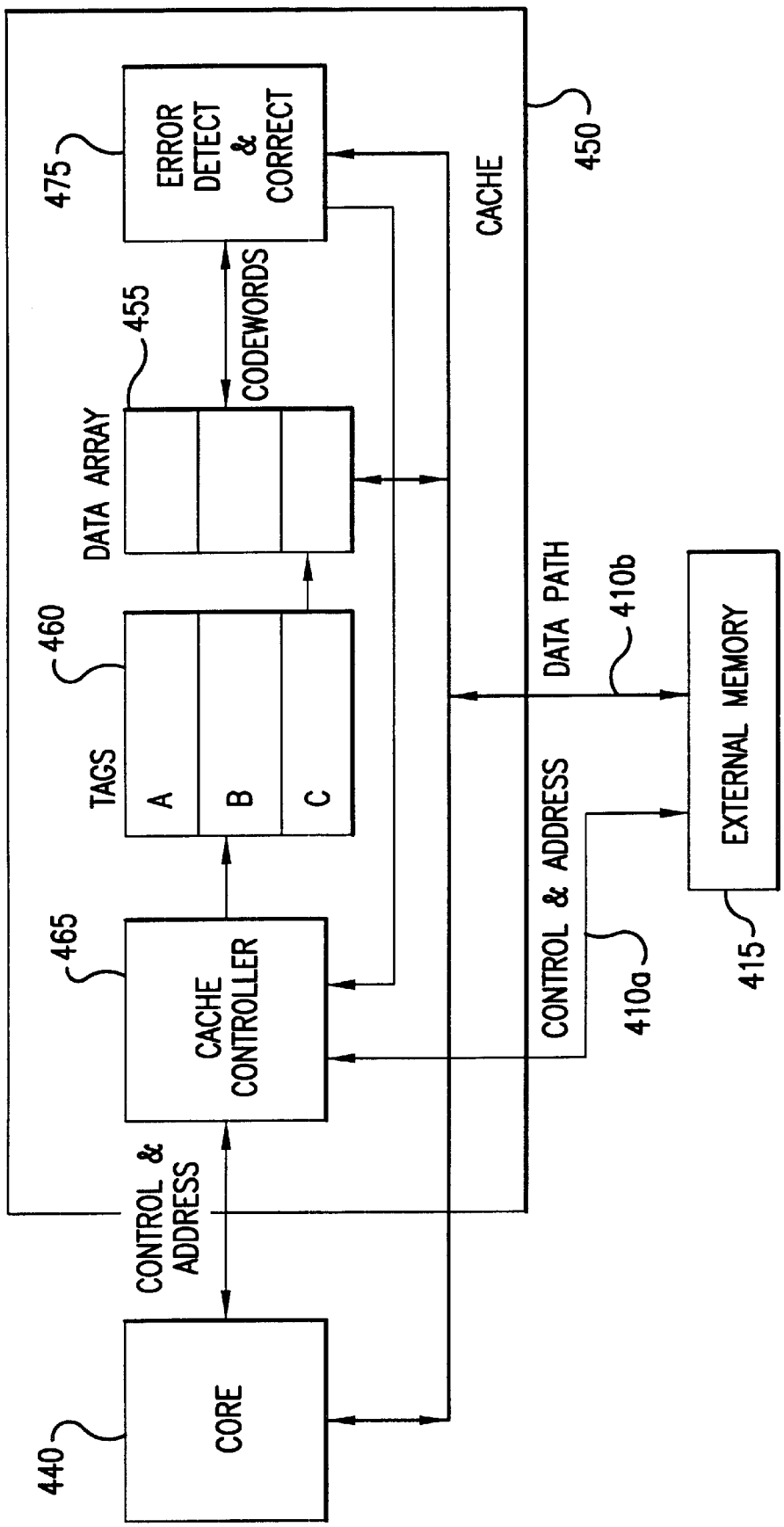
FIG. 5 is a block diagram of a cache in a computer system.

Details of the cache 450 are illustrated more fully in FIG. 5. With reference to FIG. 5, an example of a cache access will now be described. The processor core 440 requests data from the cache 450 by giving it an address and control information. The control information indicates whether the access is a read or a write, for example. The cache controller 465 compares the given address to values in the tag table 460. If a tag value matches the given address, a hit occurs and the data array 455 contents corresponding to that tag is read out. The corresponding codeword is sent to the error detection/correction circuitry 475. If an error is found, the error detection/correction circuitry 475 notifies the cache controller 465 of the error's existence and severity (e.g., whether it is correctable or not). If the error is correctable, the error detection/correction circuitry 475 can provide a codeword corresponding to the corrected line and that codeword is written into the data array 455. If the error is not correctable, then the processor core 440 is notified. If no tag match is found (i.e., a miss occurs), the requested address is sent to the main memory 415. When the data from the main memory 415 returns, the data can be loaded into the cache data array 455 or returned directly to the processor core 440 or both. Because the contents of the cache 450 is only a subset of the main memory 415, it is possible that new data will need to be written to a part of cache already allocated to another line. If this is the case, the old line is overwritten. Overwriting in this manner is know as "victimization," because the new line victimizes the old line. If the old line contains modified data (data that is different than what is in the external memory 415), then the modified data line is written out to the external memory 415 to maintain coherency.

An important part of the cache 450, for the purposes of understanding the present invention, is the error detection/correction section 475. The error detection/correction section 475 increases the reliability and robustness of the cache 450. The error detection/correction section 475 encodes incoming data as it is written in the data array 455 and decodes the data as it is read from the data array 455. During an encoding operation, a line is encoded into a codeword having a greater number of bits, the extra bits providing redundant information. For example, if the size of a data line is 32 bits, then the encoding operation produces a codeword having M bits where M>32. The purpose of encoding is to protect against data corruption, which may be caused by low probability statistical failures, cosmic rays, alpha particles or unknown sources. During a decoding operation, a codeword is read from the data array 455 and either an error detection or error correction function or both is performed, according to principles and designs well known in the art. If the codeword contains one or more corrupted bits and the coding scheme permits detection of the error, then the error detection/correction section 475 so indicates the error. In this case, the data line can be obtained from the external memory 415 and the control logic 465 can delete the erroneous line from the data array 455 or mark its corresponding tag to flag the error. If the coding scheme is more powerful and can automatically correct the error(s), then it supplies the corrected line and the system continues operation as usual. After correction of the error, the error detection/correction section 475 can replace the erroneous codeword with a non-erroneous one, or do nothing because a corrected line will be supplied the next time it is read by the error detection/correction section 475.

In a preferred embodiment, the error detection/correction section 475 employs a simple parity coding scheme. In this case, assuming again that each line is 32 bits in size, then the encoding operation writes a 33 bit codeword into the data array 455 for each line. The first 32 bits of the codeword are the same as the original 32 bits of the line to be written, and the last bit (or any predetermined position) is either 0 or 1 so as to make the total number of ones (1's) in the 33 bit codeword even (or odd, if that is the convention). When the codeword is read from the cache 450, then the error detection/correction section 475 determines whether the number of ones in the 33 bit codeword is odd and detects an error if that is the case. The single bit parity scheme is capable of detecting single bit errors, but not two or more bit errors in a line. Furthermore, the single bit parity scheme cannot correct errors. More powerful error detection and/or correction is possible using more sophisticated coding schemes, such as cyclic redundancy check (CRC) coding. In general, any linear block coding scheme or forward error correction (FEC) scheme (both of which are well known in the art) is well suited for the error detection/correction section 475.

Figure 6:
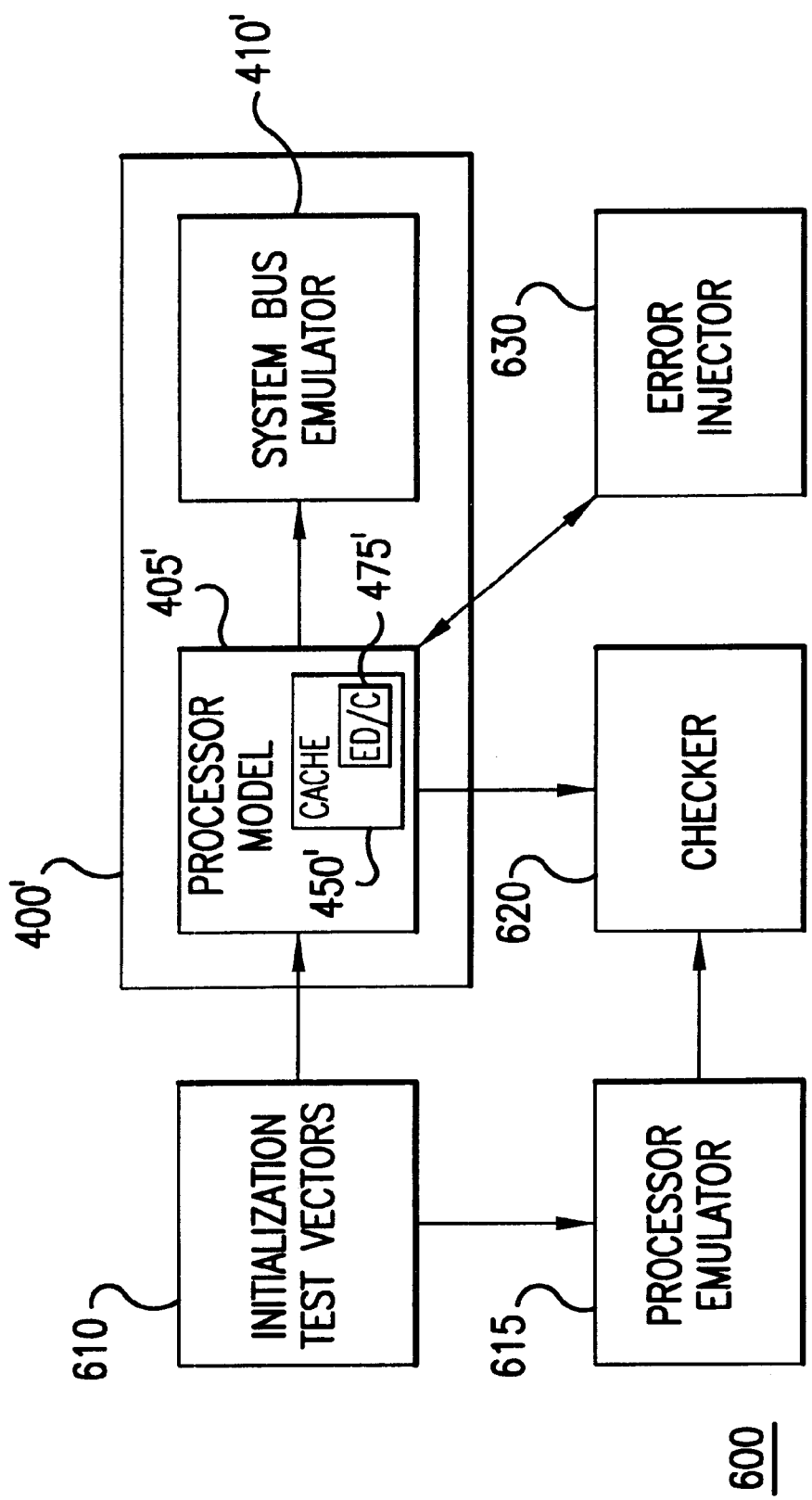
FIG. 6 is a block diagram of a testing arrangement according to one embodiment of the present invention.

FIG. 6 shows a testing arrangement 600 in which the design of the processor 405, and n particular the error detection/correction section 475, is tested. The testing arrangement 600 is a special case of the testing arrangement 300 (FIG. 3), in which the generic device model 305 is a computer model 400', which is a model of the computer 400 (FIG. 4), and the device emulator 305 is a processor emulator 615. The computer model 400' includes a more detailed processor model 405' and a less detailed system bus emulator 410'. The computer model 400' provides more detail in the processor model 405' because the design of the processor 405 is the focus of testing. The system bus emulator 410' need not be as detailed because it merely provides the external environment for the processor model 405'. Included in the processor model 405' is a cache model 450', and within the cache model 450' is an error detection/correction section model 475'. The initialization test vectors 610, checker 620 and error injector 630 in the arrangement 600 are analogous to the initialization test vectors 310, checker 320 and error injector 330 in the arrangement 300 (FIG. 3).

A triggering condition or event that prompts the error injector 630 to dynamically inject an error into a codeword variable within the processor model 405' is a cache hit. As the error injector 630 monitors cache activity in the processor model 405', the error injector 630 intercepts reads to the cache model 450' and writes an erroneous version of the codeword into the cache model 450' before the cache read is performed. For example, the error injector 630 inverts one bit of a codeword, if a single parity coding scheme is utilized. In continued simulation of the operation of the processor model 405', the error detection/correction section model 475' detects the error soon thereafter, if the error detection/correction section model 475' is operating properly. By injecting errors when a cache hit has been detected in this way, the invention easily and precisely exercises the error detection/correction section model 475'. That is to say, the invention has a hit rate that is very high (if not certain). This in turn allows focused testing at any time during simulated operation, regardless of initialization conditions.

Figure 7:
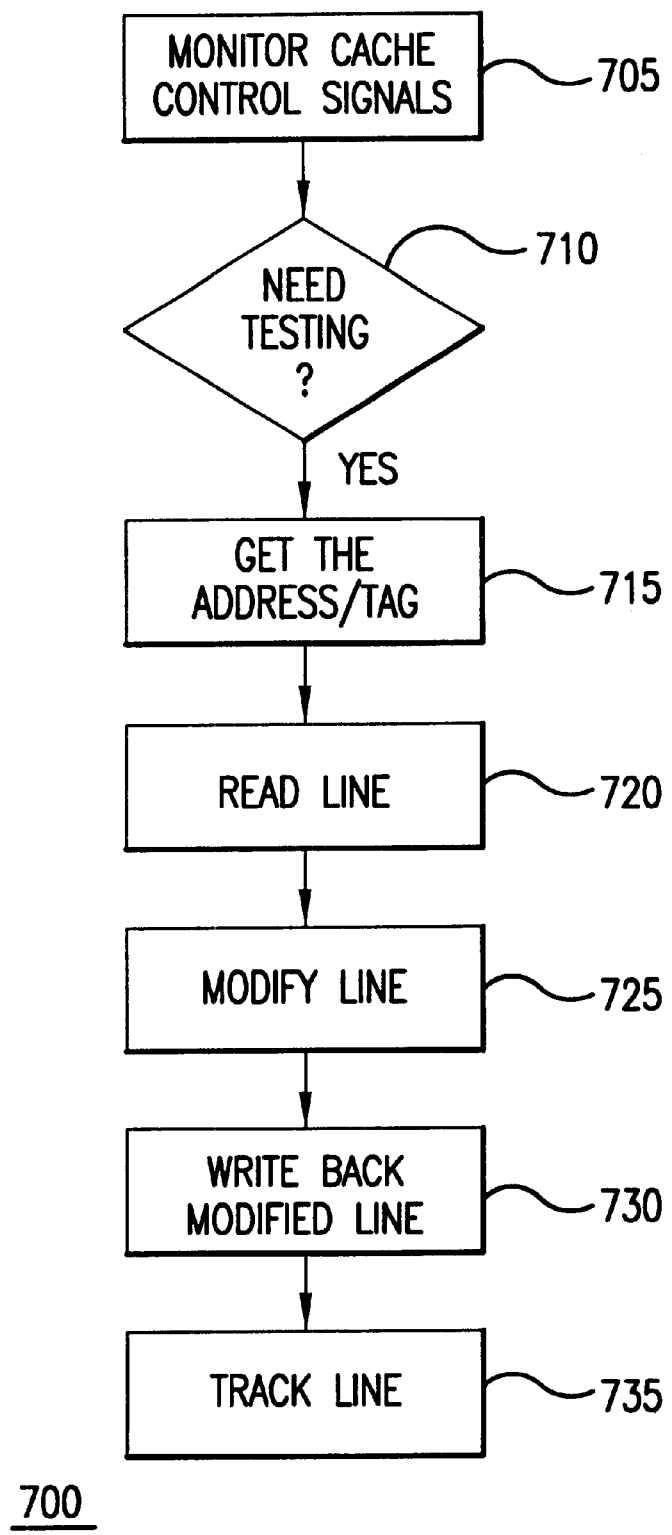
FIG. 7 is a flowchart for an error injector module in the testing arrangement depicted in FIG. 6.

FIG. 7 is a flowchart of a process 700 implemented by the error injector 630. The process 700 begins when the error injector 630 monitors (705) control signals going to/from the cache model 450' (e.g., between the cache model 450' and the core of the processor model 405' and/or between the cache model 450' and main memory on the system bus emulator 410'). Next, the process 700 determines (710) whether the monitored control signals indicate an operation (e.g., a cache hit) of the type for which testing can and should be performed. Upon determination that testing will be performed, the process 700 gets (715) the cache address or tag of the line to be altered (e.g., the line that has been hit). The process 700 loads (720) the line or a subset of the line, modifies (725) the line and writes (730) the line back into the cache. Finally, the process 700 tracks (735) the line by recording the modification in a tracking buffer. The tracking step 735 is necessary because the processor model 405' core may request another access to the modified line. If the process 700 were to modify the same line a second time, by again inverting a bit, for example, the result would either undo the first modification (if the same bit is inverted) or introduce an undetectable or uncorrectable error (if a different bit is inverted and the error detection/correction scheme is single parity or has only a single error correction capability, for example). For this reason, the determination step 710 checks the tracking buffer to see if the line has an outstanding modification that has not been corrected yet. A separate step (not shown) in the process 700 deletes a line from the tracking buffer when the injected error is corrected by the processor error detection/correction section model 475'.

Next will be described the manner in which the computer model 400', the error injector 630 and other modules are connected. As used herein with regard to modules or programs, the term "connected" means "interfaced" or "interacting with each other" in the broadest sense. In one embodiment, the processor model 405' is an RTL (register transfer language) program. The error injector 630, the system bus emulator 410', the checker 620, and the processor emulator 615 are each programs, modules or scripts written in an appropriate language, such as C or C++, for example. The initialization test vectors are one or more data files. A shell program is the interface among the various programs and/or modules. The error injector 630, for example, executes commands to the shell program. Shell commands include commands such as reading and writing values to/from the processor model 405' memory, which is shared between the processor model 405' and the shell program. To begin testing, the processor model 405' RTL program and the shell program are run. The shell program reads a configuration file that informs the shell program of such things as initialization information and which programs to run. The error injector 630, for example, is one such program. In every cycle of operation, the processor model 405' updates memory and then calls the shell program. The shell program, in turn, calls other programs such as the error injector 630. By way of shell commands, the error injector 630 reads cache lines (FIG. 7, step 720) and writes back modified cache lines (step 730). Then, control is handed back to the processor model 405', as the cycle is repeated.

In another embodiment, the processor model 405', the error injector 630, the system bus emulator 410', the checker 620, and the processor emulator 615 are each subprograms or modules that are called by a main program, which passes data among the various subprograms. The advantage of this approach is that no management of shared memory is required. At the other extreme, in yet another embodiment, each of the processor model 405', the error injector 630, the system bus emulator 410', the checker 620, and the processor emulator 615 are stand-alone programs that run independently except for ties across shared memory or other interprocess communication at a higher system level. Those skilled in the art will appreciate these and many other approaches for connecting the functional units depicted in FIG. 6 so as to perform the process illustrated in FIG. 7.

From a more general vantage, the invention is a method and apparatus for testing a program. Referring back to FIG. 6, the computer model 400' can be seen to be a program with error detection/correction functionality. Although the program in the preferred embodiment is a software simulation of a model of a design of an electronic device, the invention is not necessarily so limited and need not be associated with a physical device. The invention performs in the same manner when the computer model 400' is replaced with any program. In the more general case, the error injector 630 performs the same basic function of dynamically injecting errors into the variables manipulated or processed by the program.

Furthermore, the program need not be in the form of software, but may be firmware or hardware as well. In the case where the program is a firmware or hardware program embodied on a physical device, the connections to the initialization test vectors 610, checker 620 and error injector 630 can be hardware or software connections, as appropriate. Along the same lines of generality, the other components illustrated in FIG. 6 can be firmware or hardware modules, rather than software modules, although software is a preferred form.

The modules or programs (both terms are used interchangeably) in FIG. 6 can be stored or embodied on a computer readable medium in a variety of formats, such as source code or executable code, for example. Computer readable mediums include both storage devices and signals. Exemplary computer readable storage devices include conventional computer system RAM (random access memory), ROM (read only memory), EPROM (erasable, programmable ROM), EEPROM (electrically erasable, programmable ROM), and magnetic or optical disks or tapes. Exemplary computer readable signals, whether modulated using a carrier or not, are signals that a computer system hosting or running the invention can be configured to access, including signals downloaded through the Internet or other networks.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A method comprising:

testing the design of an electronic device comprising digital logic circuitry, wherein the digital logic circuitry comprises a memory structure; and injecting a predetermined error pattern into a value stored in the memory structure, wherein the value is operated by the design of the digital logic circuitry, the injecting step comprising:

at detecting a triggering condition; and wherein the injecting step is performed in response to detection of the triggering condition.

2. The method of claim 1 wherein the triggering condition is an access to the memory structure.

3. The method of claim 2 wherein the memory structure is a cache and the triggering condition is a cache hit.

4. The method of claim 2 wherein the memory structure is a buffer.

5. The method of claim 1 wherein the error pattern is detectable.

6. The method of claim 1 wherein the error pattern is correctable.

7. The method of claim 1 wherein the digital logic circuitry comprises error detection circuitry.

8. The method of claim 1 wherein the digital logic circuitry comprises error correction circuitry.

9. The method of claim 1 wherein the electronic device is a processor.

10. The method of claim 1 wherein the testing step comprises:

simulating operation of the electronic device using a model;

simulating operation of the electronic device using an emulator, wherein the emulator is less detailed than the model;

monitoring the simulated operations of the model and the emulator; and comparing the simulated operations of the model and the emulator for differences.

11. An apparatus comprising:

a program comprising an error detector;

an error injector module connected to the program, wherein the error injector module detects a triggering condition, and wherein the error injector module injects a predetermined error pattern into a value stored in a memory structure connected to the apparatus in response to detection of the triggering condition; and a checker module connected to the program, whereby the checker module is capable of determining whether the program responds appropriately to an error dynamically produced by the error injector module during execution of the program.

12. The apparatus of claim 11 wherein the program comprises a simulation of a model of an electronic device comprising error detection circuitry.

13. The apparatus of claim 12 further comprising:

an emulator of the electronic device, wherein the emulator is connected to the checker module, and wherein the emulator is less detailed than the model.

14. The apparatus of claim 11 further comprising:

test vectors that establish an initial condition for the program.

15. Computer software embedded on a computer readable medium, the computer software comprising the following software components:

a software program comprising an error detector;

an error injector module connected to the software program, wherein the error injector module detects a triggering condition, and wherein the error injector module injects a predetermined error pattern into a value stored in a memory structure connected to the computer software in response to detection of the triggering condition; and a checker module connected to the software program, whereby the checker module is capable of determining whether the software program responds appropriately to an error dynamically produced by the error injector module during execution of the software program.

16. The computer software of claim 15 wherein the software program comprises a simulation of a model of an electronic device comprising error detection circuitry.

17. The computer software of claim 16 further comprising:

an emulator of the electronic device, wherein the emulator is connected to the checker module, and wherein the emulator is less detailed than the model.

18. The computer software of claim 15 further comprising:

test vectors that establish an initial condition for the software program.

19. The computer software of claim 18 wherein the test vectors are useful with the software program in the absence of the error injector module.

* * * * *

UNITED STATES PATENT AND TRADEMARK OFFICE
CERTIFICATE OF CORRECTION

PATENT NO. : 6,539,503 B1
DATED : March 25, 2003
INVENTOR(S) : Shawn Kenneth Walker It is certified that error appears in the above-identified patent and that said Letters Patent is hereby corrected as shown below:

Column 8,
Line 38, delete "at"

Signed and Sealed this

Nineteenth Day of October, 2004

JON W. DUDAS
*Director of the United States Patent and Trademark Office*